(12) United States Patent
Watanabe

(10) Patent No.: US 8,963,545 B2
(45) Date of Patent: Feb. 24, 2015

(54) MAGNETIC SENSOR

(75) Inventors: Takayuki Watanabe, Tokyo (JP); Satomi Watanabe, legal representative, Fuji (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 278 days.

(21) Appl. No.: 13/321,740

(22) PCT Filed: Jun. 29, 2010

(86) PCT No.: PCT/JP2010/004293
§ 371 (c)(1),
(2), (4) Date: Feb. 1, 2012

(87) PCT Pub. No.: WO2011/001667
PCT Pub. Date: Jan. 6, 2011

(65) Prior Publication Data
US 2012/0139535 A1  Jun. 7, 2012

(30) Foreign Application Priority Data

Jun. 30, 2009  (JP) ................. 2009-155826

(51) Int. Cl.
*G01R 33/02* (2006.01)
*G01R 33/07* (2006.01)
*H01L 43/06* (2006.01)

(52) U.S. Cl.
CPC .............. *G01R 33/07* (2013.01); *G01R 33/072* (2013.01); *H01L 43/065* (2013.01)
USPC ........... 324/252; 324/510; 324/511; 324/251; 324/207.21; 324/207.2; 360/112; 360/313; 360/327; 365/7; 365/8; 365/9; 365/158

(58) Field of Classification Search
USPC .......................... 324/251–252, 207.21, 207.2; 327/510–511; 360/112, 313–327.33; 365/7–9, 158, 170–173; 257/421–427; 438/3, 14–15, 17
See application file for complete search history.

(56) References Cited

U.S. PATENT DOCUMENTS 4,584,552 A    4/1986 Suzuki et al.
5,621,377 A *  4/1997 Dettmann et al. .......... 338/32 R
(Continued)

FOREIGN PATENT DOCUMENTS

CN    1249038 A    3/2000
(Continued)

OTHER PUBLICATIONS

International Search Report for PCT/JP2010/004293.
Office Action issued in corresponding Chinese Patent Application No. 201080028529.4 dated Aug. 20, 2013.

*Primary Examiner* — Huy Q Phan
*Assistant Examiner* — Temilade S Rhodes-Vivour
(74) *Attorney, Agent, or Firm* — Morgan, Lewis & Bockius LLP

(57) ABSTRACT

The present invention relates to a magnetic sensor that provides the sensitivity adjustment on a wafer and that has a superior mass productiveness and a small characteristic variation. The magnetic sensor includes a magnetic sensitive portion provided on a substrate that is made of a compound semiconductor and that has a cross-shaped pattern. This magnetic sensitive portion includes input terminals and output terminals. At least one of input terminals of the input terminal is series-connected to a trimming portion having a compound semiconductor via a connection electrode. By performing laser trimming on the trimming portion series-connected via the connection electrode to the magnetic sensitive portion while performing a wafer probing (electric test), the adjustment of the constant voltage sensitivity is provided.

13 Claims, 16 Drawing Sheets

(56) References Cited

U.S. PATENT DOCUMENTS

| | | | |
|---|---|---|---|
| 5,912,556 A * | 6/1999 | Frazee et al. | 324/207.2 |
| 6,448,768 B1 * | 9/2002 | Ishibashi et al. | 324/251 |
| 6,590,389 B1 * | 7/2003 | Shibasaki et al. | 324/252 |
| 2002/0021126 A1 * | 2/2002 | Ishibashi et al. | 324/251 |
| 2005/0029608 A1 * | 2/2005 | Ueda et al. | 257/425 |
| 2005/0088786 A1 * | 4/2005 | Gill | 360/324.2 |
| 2005/0230770 A1 * | 10/2005 | Oohira | 257/421 |

FOREIGN PATENT DOCUMENTS

| | | |
|---|---|---|
| CN | 101303239 A | 11/2008 |
| EP | 0964259 A1 | 12/1999 |
| JP | 55-134992 | 10/1980 |
| JP | 56-60077 | 5/1981 |
| JP | 58-171879 | 10/1983 |
| JP | 1-199180 | 8/1989 |
| JP | 4-279071 | 10/1992 |

* cited by examiner

MAGNETIC SENSOR

RELATED APPLICATIONS

The present application is a U.S. National Phase Application of International Application No. PCT/JP2010/004293 (filed Jun. 29, 2010) which claims priority to Japanese Patent Application No. 2009-155826 (filed Jun. 30, 2009) which are hereby incorporated by reference in their entirety.

TECHNICAL FIELD

The present invention relates to a magnetic sensor including a magnetic sensitive portion composed of a compound semiconductor. More particularly, the present invention relates to a magnetic sensor that includes a magnetic sensitive portion and a trimming portion that can adjust sensitivity.

BACKGROUND ART

Generally, a magnetic sensor has been widely used for a current detection element and a position detection element for example. In recent years, more magnetic sensors have a higher accuracy and have higher requirements for magnetic sensor characteristics (sensitivity and an offset voltage) regarding a reduced variation. Generally, a characteristic is adjusted on a sensor module circuit on which a magnetic sensor is mounted based on the variable resistance for example. If the variation among magnetic sensors can be reduced on wafers, a step of adjusting the individual magnetic sensors on circuits is eliminated, thus realizing a lower cost as well as a smaller size and a lighter weight.

FIG. 1A and FIG. 1B are a configuration diagram illustrating a conventional magnetic sensor. FIG. 1A is top view. FIG. 1B is a cross-sectional view taken along the line IB-IB' in FIG. 1A. FIG. 2 is a circuit diagram illustrating the equivalent circuit of FIG. 1A. In the drawings, the reference numeral 1 denotes a magnetic sensitive portion, the reference numerals 1a and 1b denote an input terminal of a magnetic sensitive portion, the reference numerals 1c and 1d denote an output terminal of a magnetic sensitive portion, the reference numeral 2 denotes a bonding electrode pad, the reference numeral 5 denotes a protection layer, and the reference numeral 6 denotes a substrate.

A conventional magnetic sensor is structured, as shown in FIG. 1A and FIG. 1B, so that a substrate 6 has thereon a magnetic sensitive portion 1 that is composed of a compound semiconductor and that has a cross-shaped pattern. This magnetic sensitive portion 1 constitutes a bridge circuit as shown in FIG. 2. The magnetic sensitive portion 1 includes input terminals 1a and 1b and output terminals 1c and 1d. These input terminals 1a and 1b and output terminals 1c and 1d are connected to bonding electrode pads 2, respectively. The magnetic sensitive portion 1 has thereon a protection layer 5.

The conventional magnetic sensor having the configuration as described above does not have a trimming portion. Thus, as shown in FIG. 2, the constant voltage Vin is directly applied between the input terminals 1a and 1b of the magnetic sensitive portion 1. A constant voltage sensitivity of a magnetic sensor is determined depending on a compound semiconductor mobility and the shape of the magnetic sensitive portion 1 (a ratio between the length and the width) and the constant voltage Vin. This means that the semiconductor layer mobility and the variation in the magnetic sensitive portion shape between elements (between a wafer plane and the wafer) directly result in the variation in the constant voltage sensitivity, thus failing to adjust the constant voltage sensitivity.

Among methods for reducing the variation in the magnetic sensor characteristic as described above, a method is known as disclosed in Patent Documents 1 and 2 for example to trim the magnetic sensor. The method disclosed in Patent Document 1 relates to a Hall element having a small unbalanced voltage according to which, while measuring a voltage between Hall voltage terminals, a slit of a required amount is provided in the Hall voltage terminal and an attachment section and a method is used to subject the magnetic sensitive portion to metal plating. By the method as described above, the offset voltage is adjusted.

FIG. 3 is a circuit diagram illustrating an equivalent circuit of the above-described magnetic sensor disclosed in Patent Document 1. In FIG. 3, the reference numerals 11a and 11b denote an input terminal of a magnetic sensitive portion, and the reference numerals 11c and 11d denote an output terminal of a magnetic sensitive portion. This Patent Document 1 discloses that the magnetic sensitive portion can be trimmed to adjust the offset voltage. However, the constant voltage sensitivity cannot be adjusted since the voltage Vin applied to the magnetic sensitive portion (bridge circuit) is constant, the constant voltage sensitivity.

The method disclosed in Patent Document 2 relates to a magnetic sensor used for a speed sensor or a magnetic encoder according to which a resistor body constituting a bridge in a magnetic resistive element is trimmed by being subjected to laser irradiation to thereby adjust the offset voltage.

As described above, in the case of any of the above-described methods disclosed in Patent Document 1 and 2, the offset voltage can be adjusted on the wafer. However, these conventional methods could not adjust the sensitivity.

The present invention has been made in view of the above disadvantage. It is an objective of the present invention to provide a magnetic sensor for which the sensitivity can be adjusted on a wafer, the mass-productiveness is superior, and the characteristic variation is small.

CITATION LIST

Patent Document

Patent Document 1: Japanese Patent Laid-Open No. S55-134992(1980)
Patent Document 2: Japanese Patent Laid-Open No. H1-199180 (1989)

SUMMARY OF INVENTION

The present invention has been made in view of the objective as described above. The invention is characterized in that a magnetic sensor including a magnetic sensitive portion composed of a compound semiconductor provided in a substrate, wherein the magnetic sensitive portion includes an input terminal and an output terminal and at least one of input terminals of the input terminal is series-connected to a trimming portion having the compound semiconductor via a connection electrode (which corresponds to Illustrative Embodiment 1 of FIG. 6).

The invention is also characterized in that the trimming portion includes a trimming layer and a first compound semiconductor layer provided on the trimming layer and the first compound semiconductor layer is composed of material through which trimming laser beam passes (which corresponds to Illustrative Embodiment 2 of FIG. 7).

The invention is also characterized in that the trimming portion includes: a trimming layer and a second compound semiconductor layer provided under the trimming layer and the second compound semiconductor layer is composed of material through which trimming laser beam passes (which corresponds to Illustrative Embodiment 3 of FIG. 12).

The first and second compound semiconductor layers are composed of an AlGaAsSb layer. The trimming layer is composed of an InAs layer.

According to the present invention, the input terminal of the magnetic sensitive portion of the magnetic sensor is series-connected to the trimming portion having the same compound semiconductor as that of the magnetic sensitive portion via a connection electrode. While a wafer probing (electric test) is being performed, laser trimming can be used to change the resistance value of the trimming portion to thereby adjust the sensitivity, thus providing a magnetic sensor for which the mass-productiveness is superior and the characteristic variation is small.

DESCRIPTION OF EMBODIMENTS

Figure 4A:
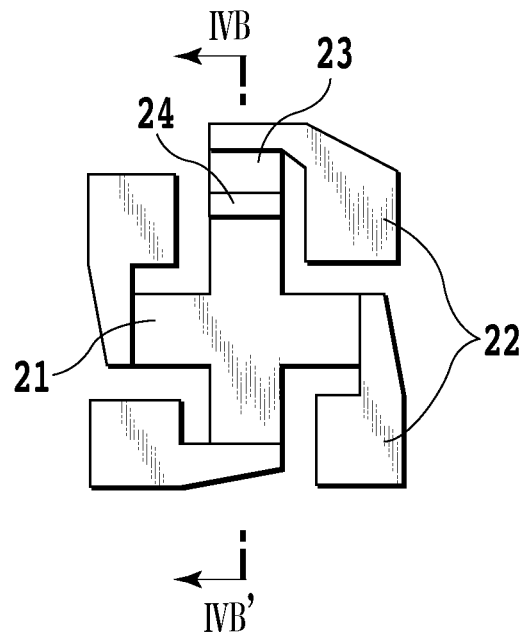
FIG. 4A is a configuration diagram and a top view illustrating an embodiment of the magnetic sensor of the present invention.
Figure 4B:
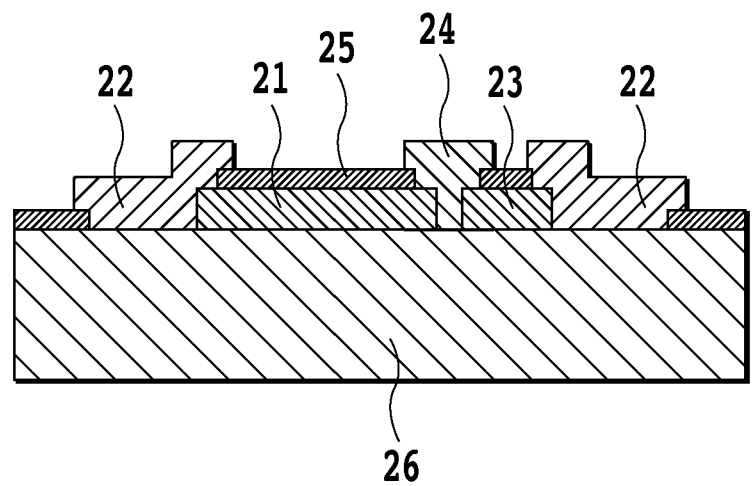
FIG. 4B is a configuration diagram illustrating an embodiment of the magnetic sensor of the present invention and is a cross-sectional view taken along the line IVB-IVB' in FIG. 4A.
Figure 5:
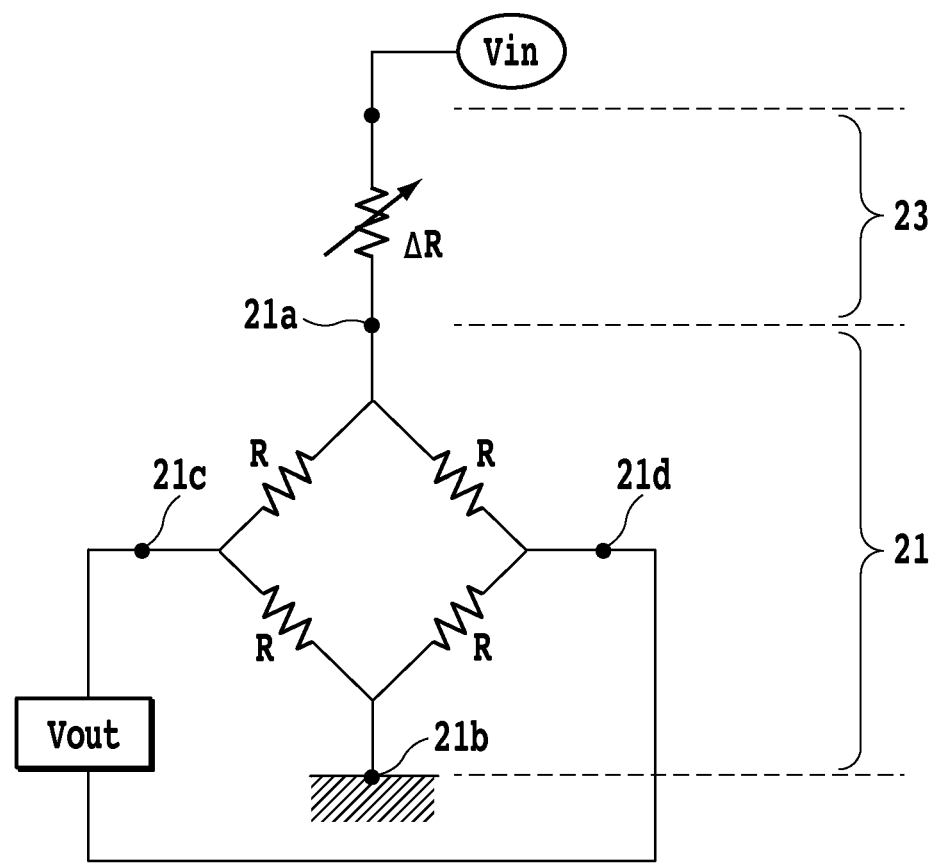
FIG. 5 is a circuit diagram illustrating the equivalent circuit of FIG. 4A.

The following section will describe an embodiment of the present invention with reference to the drawings. FIG. 4A and FIG. 4B are a configuration diagram illustrating the magnetic sensor of the present invention. FIG. 4A is a top view. FIG. 4B is a cross-sectional view taken along the line IVB-IVB' in FIG. 4A. FIG. 5 is a circuit diagram illustrating the equivalent circuit of FIG. 4A. In the drawings, the reference numeral 21 denotes a magnetic sensitive portion, the reference numerals 21a and 21b denote an input terminal of the magnetic sensitive portion, the reference numerals 21C and 21d denote an output terminal of the magnetic sensitive portion, the reference numeral 22 denotes a bonding electrode pad, the reference numeral 23 denotes a trimming portion, the reference numeral 24 denotes a connection electrode, the reference numeral 25 denotes a protection layer, and the reference numeral 26 denotes a substrate.

The magnetic sensor of the present invention includes a magnetic sensitive portion 21 having a cross-shaped pattern that is provided on a substrate 26 and that is composed of a compound semiconductor. This magnetic sensitive portion 21 includes input terminals 21a and 21b and output terminals 21c and 21d. At least one of input terminals 21a of the input terminals 21a and 21b is series-connected to a trimming portion 23 having a compound semiconductor via a connection electrode 24.

By the configuration as described above, the trimming portion 23 and the magnetic sensitive portion 21 are series-connected via the connection electrode 24. By adjusting the resistance value R of the trimming portion 23 by laser trimming for example, a constant voltage can be applied to the magnetic sensor. By changing the ratio in the resistance value R between the trimming portion 23 and the magnetic sensitive portion 21 that are series-connected, the voltage applied to the magnetic sensitive portion 21 can be adjusted arbitrarily.

Figure 1A:
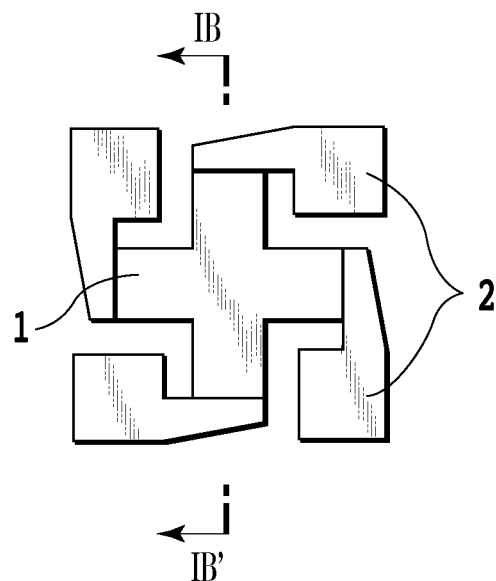
FIG. 1A is a configuration diagram and a top view illustrating a conventional magnetic sensor.
Figure 1B:
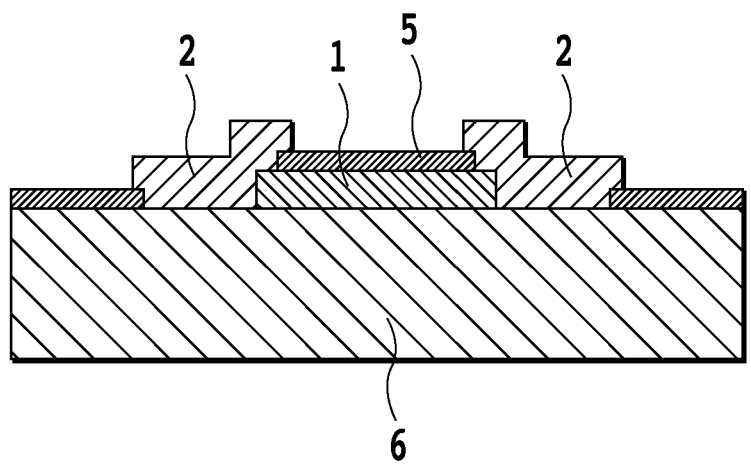
FIG. 1B is a cross-sectional view taken along the line IB-IB' in FIG. 1A.
Figure 2:
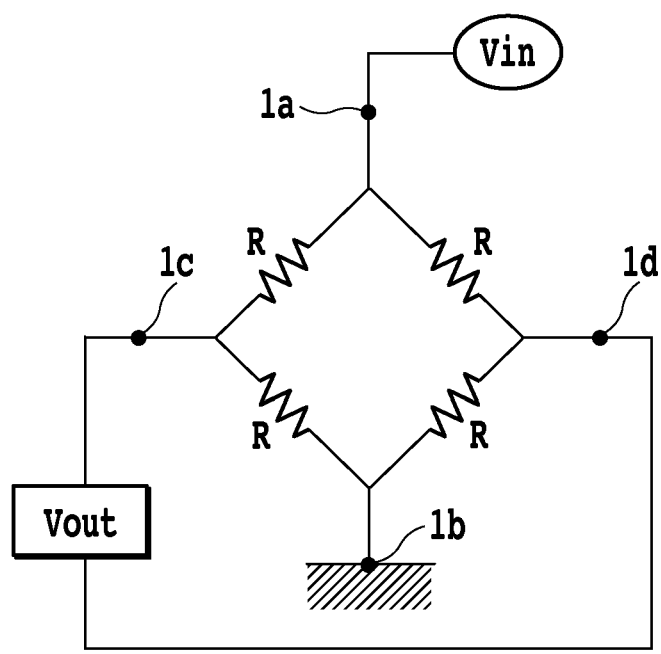
FIG. 2 is a circuit diagram illustrating the equivalent circuit of FIG. 1A.
Figure 3:
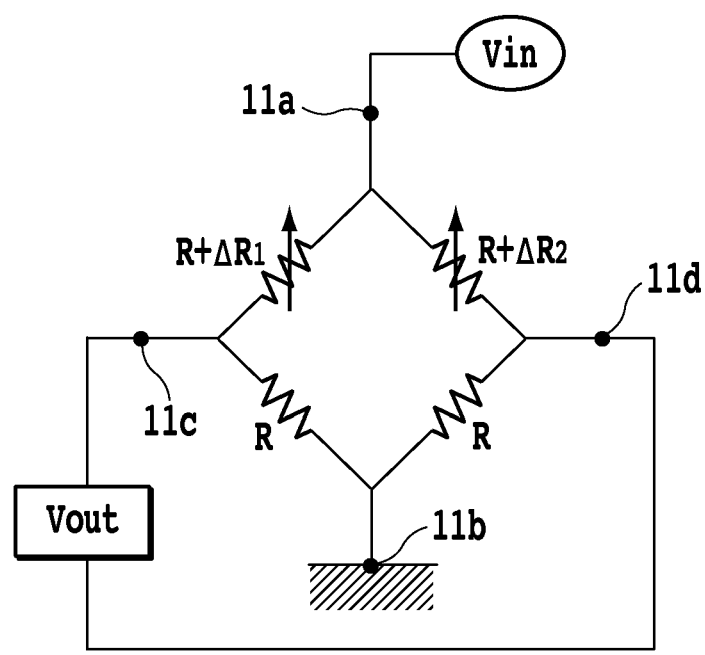
FIG. 3 is a circuit diagram illustrating the equivalent circuit of the magnetic sensor disclosed in Patent Document 1.

Specifically, when an electric characteristic such as a constant voltage sensitivity is measured by wafer probing, the resistance value R of the trimming portion 23 can be changed while monitoring the constant voltage sensitivity to adjust, to a fixed value, the sensitivity variation among the magnetic sensors caused by the mobility and the shape of the magnetic sensitive portion 21. As described above, when the equivalent circuit of the conventional magnetic sensor shown in FIG. 3 is compared with the equivalent circuit of the magnetic sensor of the present invention shown in FIG. 5, the conventional one allows a fixed voltage to be applied to the magnetic sensitive portion (bridge circuit) 1, thus failing to adjust the constant voltage sensitivity. In contrast with the conventional one, the equivalent circuit of the magnetic sensor of the present invention on the other hand can change the resistance value R of the trimming portion 23 to thereby arbitrarily adjust the voltage applied to the magnetic sensitive portion (bridge circuit) 21.

Illustrative Embodiment 1

Figure 6:
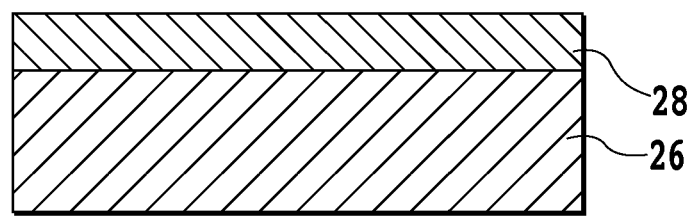
FIG. 6 is a configuration diagram illustrating Illustrative Embodiment 1 of a substrate and a trimming portion in the magnetic sensor of the present invention.

FIG. 6 is a configuration diagram illustrating Illustrative Embodiment 1 of the substrate and the trimming portion in the magnetic sensor of the present invention. In the drawings, the reference numeral 26 denotes a GaAs substrate and the reference numeral 28 denotes an InAs layer (trimming layer). The InAs layer (trimming layer) 28 corresponds to the trimming portion 23 in FIG. 4.

The trimming portion 23 of the present invention may be composed of any material so long as the material is the same compound semiconductor as that of the magnetic sensitive portion 21. For example, a compound semiconductor thin film may be formed on the substrate 26 (e.g., GaAs or Si) by the molecular beam epitaxy (MBE) or the metalorganic chemical vapor deposition (MOCVD) or a GaAs substrate of a compound semiconductor (e.g., a GaAs substrate) may be subjected to ion implantation with Si to subsequently subject the substrate to activation annealing to thereby form a trimming portion.

When the trimming portion 23 covered with a protection layer 25 such as oxide silicon or silicon nitride is illuminated with laser beam, the laser beam passes through the protection layer 25 and is absorbed by the trimming layer 28. Then, this trimming layer 28 is melted and solidified to thereby cause a change in the resistance value R. In the present invention, the trimming layer is made of a compound semiconductor. Thus, in contrast with the general trimming method to evaporate metal material for link removal, the trimming is possible even without a complete removal while suppressing the damage to the protection layer 25.

The protection layer 25 functions to suppress the corrosion of the compound semiconductor layer due to the external atmosphere such as water and is required for a reliable device. Although it is not impossible to form the protection layer 25 after the laser trimming, it may cause, due to the thermal history in the step of forming the protection layer 25, the shift of the characteristic adjusted by the trimming. This, forming the protection layer 25 after the laser trimming is not suitable for an environment because this is not suitable for the reduction of the variation in the characteristic, because the trimming in the middle of the step causes an increased number of probings when compared with the case where the trimming is performed during the wafer test after the completion of the device, and because the trimming without the existence of the protection layer 25 may case the diffusion of As for example. Due to these reasons, the trimming is preferably performed while the protection layer 25 is being formed (i.e., after the device is formed).

The layer structure of the trimming portion 23 may be a single layer structure of a compound semiconductor or also may be a layered structure (multilayer structure) is not particularly limited. The layer structure of the trimming portion 23 is preferably configured so that the trimming layer for absorbing trimming laser beam has thereon the first compound semiconductor layer through which trimming laser beam passes (see Illustrative Embodiment 2 (which will be described alter)). A further preferred configuration is that the trimming layer for absorbing trimming laser beam has, at the lower side thereof, the second compound semiconductor layer through which trimming laser beam passes (see Illustrative Embodiment 3 which will be described later).

Illustrative Embodiment 2

Figure 7:
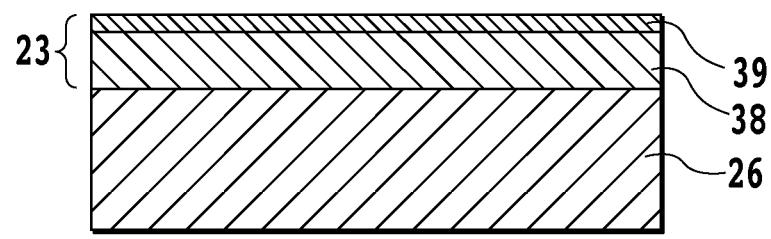
FIG. 7 is a configuration diagram illustrating Illustrative Embodiment 2 of a trimming portion including a substrate and the first compound semiconductor layer in the magnetic sensor of the present invention.

FIG. 7 is a configuration diagram illustrating Illustrative Embodiment 2 of the substrate and the trimming portion in the magnetic sensor of the present invention. In the drawing, the reference numeral 26 denotes a GaAs substrate, the reference numeral 38 denotes an InAs layer (trimming layer), and the reference numeral 39 denotes an AlGaAsSb layer (the first compound semiconductor layer). The InAs layer (trimming layer) 38 and the AlGaAsSb layer (the first compound semiconductor layer) 39 correspond to the trimming portion 23 in FIG. 4.

When laser beam is emitted to the trimming portion 23 covered by the protection layer 25, laser beam passes through the protection layer 25 and the first compound semiconductor layer 39 and is absorbed by the trimming layer 38. Then, the trimming layer 38 is melted and solidified to thereby cause a change in the resistance value R. When the protection layer 25 is abutted to the trimming layer 38, stress is applied to the protection layer 25 when the trimming layer 38 is melted and solidified. However, the stress to the protection layer 25 can be suppressed by providing, between the trimming layer 38 and the protection layer 25, the first compound semiconductor layer 39 through which trimming laser beam passes without being absorbed.

Figure 8A:
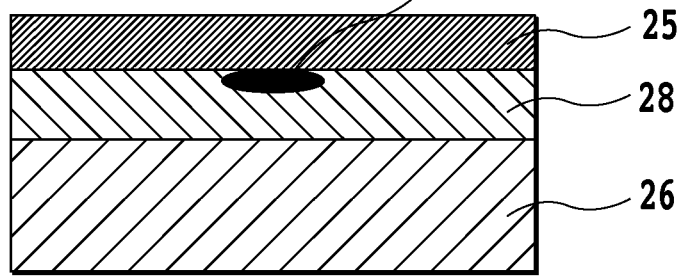
FIG. 8A is a concept diagram illustrating the cross section of the InAs layer trimmed by low power.
Figure 8B:
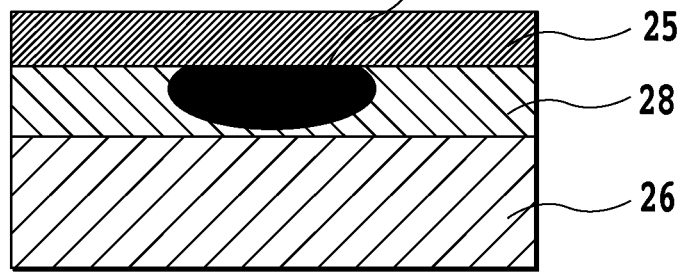
FIG. 8B is a concept diagram illustrating the cross section of the InAs layer trimmed by high power.
Figure 9A:
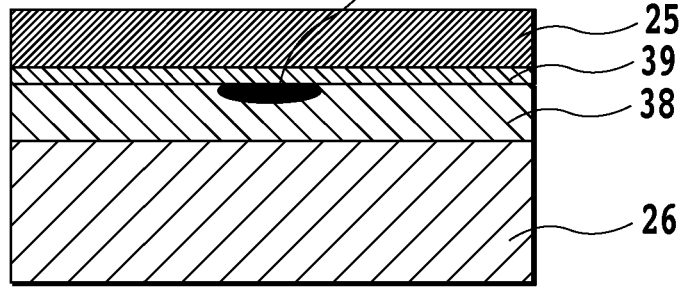
FIG. 9A is a concept diagram illustrating the cross section of the InAs layer trimmed by low power.
Figure 9B:
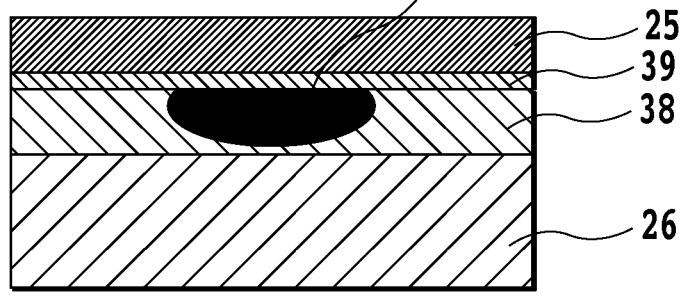
FIG. 9B is a concept diagram illustrating the cross section of the InAs layer trimmed by high power.

The concept diagram of the cross section of the trimmed InAs layer is shown in FIG. 8A and FIG. 8B (Illustrative Embodiment 1) and FIG. 9A and FIG. 9B (Illustrative Embodiment 2). The low-power trimming can cause a change in the cross section in any of the structures without a substantial stress to the protection layer. However, the high-power trimming for causing a deeper part of the InAs layer to be melted and solidified to increase the resistance change rate causes, in the structures in FIG. 8A and FIG. 8B, the melted and solidified part is abutted to the protection layer, which causes a high stress to the protection layer to cause a crack, thus causing a possibility of a deteriorated quality. On the other hand, the structures in FIG. 9A and FIG. 9B provide the first compound semiconductor layer between the protection layer and the trimming layer to thereby reduce the stress to the protection layer even at high power, thus realizing trimming. The first compound semiconductor layer has a forbidden bandwidth at which no laser beam is absorbed and is made of a material having a sufficient resistance to the trimming layer.

Figure 10:
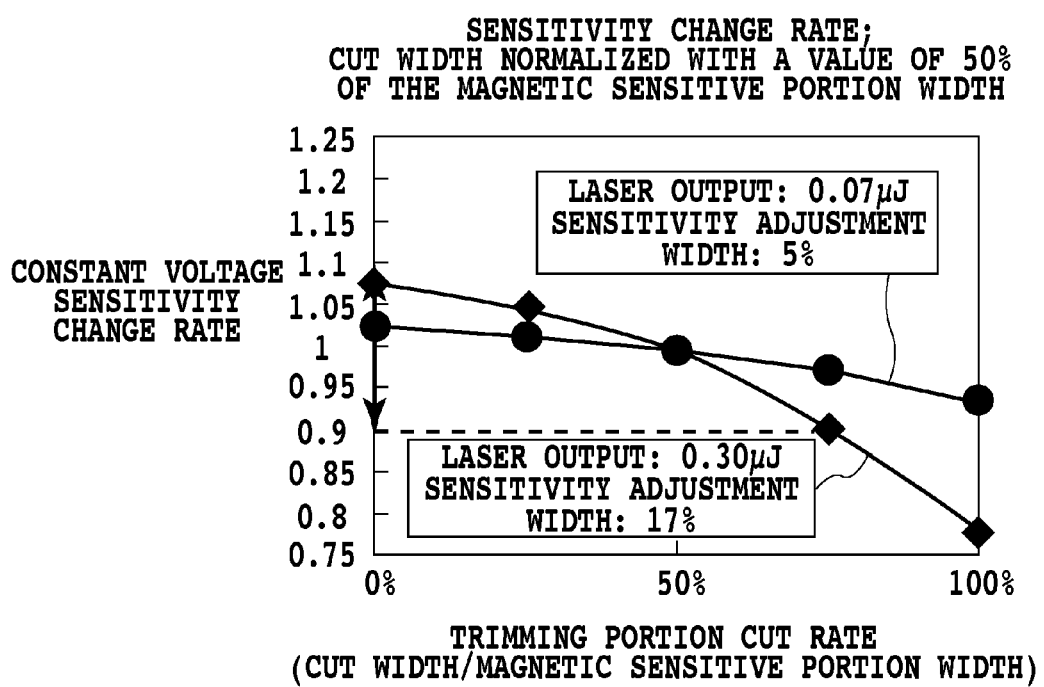
FIG. 10 illustrates the relation between a trimming portion cut rate and a constant voltage sensitivity change rate.
Figure 11:
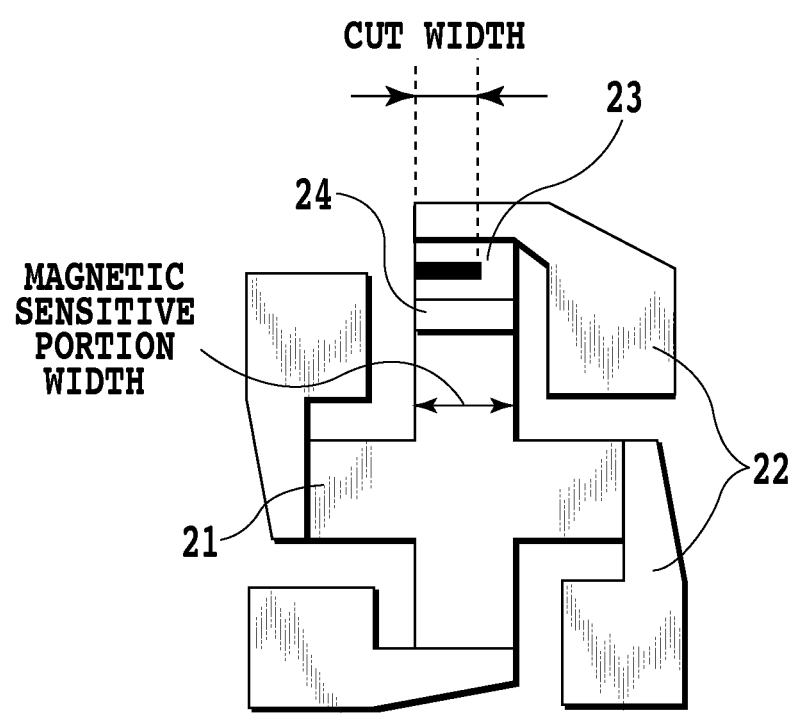
FIG. 11 illustrates a ratio between a cut width and a magnetic sensitive portion width.

FIG. 10 shows the relation between the trimming portion cut rate and the constant voltage sensitivity change rate in the present invention (cut rate: the ratio between the cut width and the magnetic sensitive portion width in FIG. 11). The constant voltage sensitivity change rate is different depending on laser output. The sensitivity adjustment width (constant voltage sensitivity change rate) within the range of the cut rate from 0 to 75% was 5% for laser output of 0.07 µJ and was 17% for laser output of 0.30 µJ.

Illustrative Embodiment 3

Figure 12:
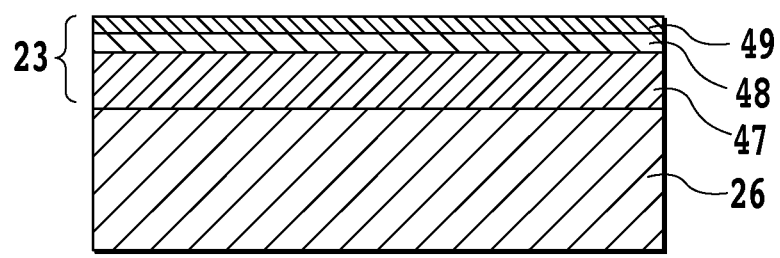
FIG. 12 is a configuration diagram illustrating Illustrative Embodiment 3 of a trimming portion including a substrate and the first and second compound semiconductor layers in the magnetic sensor of the present invention.

FIG. 12 is a configuration diagram illustrating Illustrative Embodiment 3 of the substrate and the trimming portion in the magnetic sensor of the present invention. In the drawing, the reference numeral 26 denotes the GaAs substrate, the reference numeral 47 denotes a lower AlGaAsSb layer (the second compound semiconductor layer), the reference numeral 48 denotes an InAs layer (trimming layer), and the reference numeral 49 denotes an upper AlGaAsSb layer (the first compound semiconductor layer). The lower AlGaAsSb layer (second compound semiconductor layer) 47, the InAs layer (trimming layer) 48, and the upper AlGaAsSb layer (first compound semiconductor layer) 49 correspond to the trimming portion 23 in FIG. 4. In order to avoid the surface oxidation of the upper AlGaAsSb layer, a further GaAs layer is preferably provided thereon for higher quality.

The second compound semiconductor layer 47 is made of material through which trimming laser beam passes without being absorbed. Thus, laser beam is absorbed only by the trimming layer 48. Thus, trimming can be efficiently performed with low-power laser beam. The second compound semiconductor layer 47 is preferably made of such material that has a lattice constant close to that of the material of the trimming layer 48.

Figure 13:
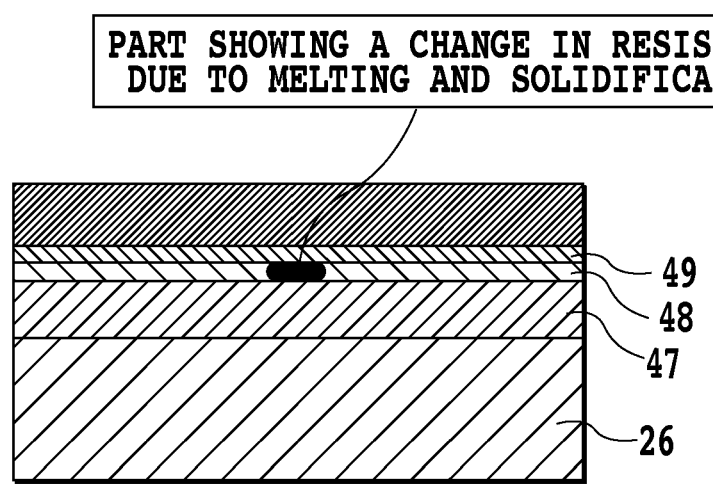
FIG. 13 illustrates how the entire InAs layer is melted and solidified even by low-power laser beam.
Figure 14:
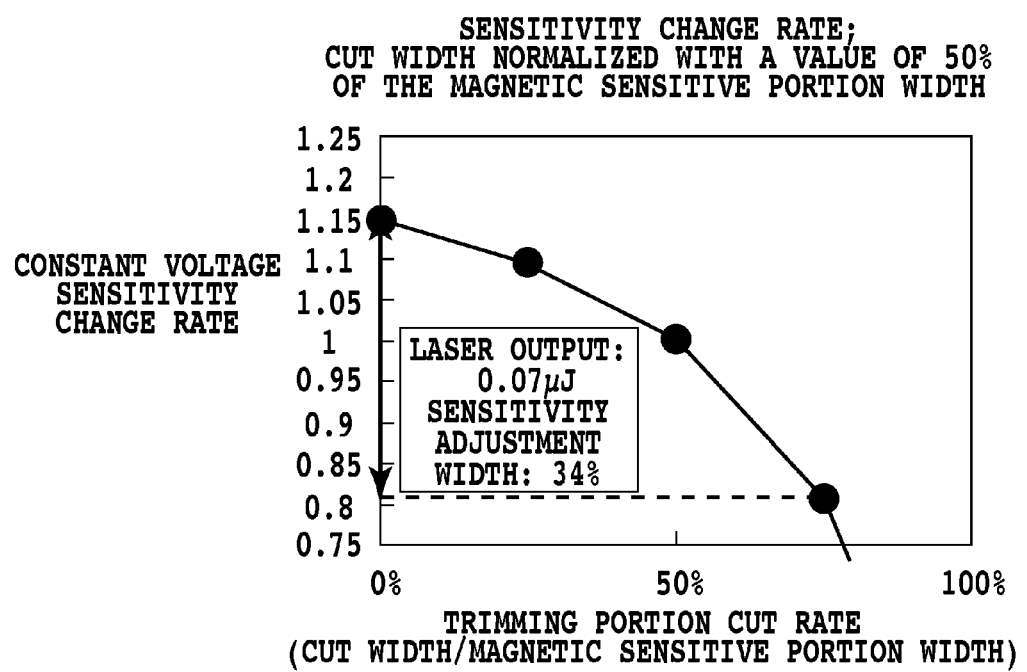
FIG. 14 illustrates the relation between the trimming portion cut rate and the constant voltage sensitivity change rate.

A specific example will be described below. When the GaAs substrate 26 has directly thereon an InAs layer as the trimming layer 48, a remarkable difference in the lattice constant between GaAs and InAs requires a high-quality InAs layer to have 300 nm or more. Thus, in order to trim the entire InAs layer to have a higher resistance, high-power laser beam is required. To solve this, when an AlGaAsSb layer having a lattice constant close to that of InAs is formed on the GaAs substrate 26 to subsequently form an InAs layer thereon, such a trimming layer (InAs layer) 48 can be formed that is thin but that has a high quality. In order to make a high-performance magnetic sensor in the structure having an AlGaAsSb layer having a close lattice constant at the upper and lower sides of the InAs layer and in order to perform trimming with a low power without causing a damage on the protection layer, the InAs layer preferably has a thickness of 1 to 200 nm and further preferably has a thickness of 30 to 100 nm for production reasons. When compared with a case where the trimming layer 48 is directly formed on the GaAs substrate 26, the InAs layer can have a thinner thickness. At the same time, as shown in FIG. 13, the entire InAs layer can be melted and solidified even with low-power laser beam, thus adjusting the resistance value of the trimming portion efficiently. The low-power trimming can reduce the area to be melted and solidified and can reduce the length of the trimming portion, thus achieving a smaller pellet size, which is also advantageous in cost. FIG. 14 shows the relation between the trimming portion cut rate and the constant voltage sensitivity change rate in the present invention. The sensitivity adjustment width (constant voltage sensitivity change rate) in the range of the cut rate of 0 to 75% was 35% for the laser output of 0.07 µJ. When this is compared with a case where the InAs film is thick (Illustrative Embodiment 2), this provides a wider sensitivity adjustment width. In other words, the characteristic can be adjusted with a short cut length. Thus, the layered structure in which the upper and lower sides of the trimming layer have compound semiconductor layers that allows trimming laser beam to pass therethrough and that has a lattice constant close to that of the trimming layer is suitable as a structure for the trimming portion.

The following section will describe, based on FIG. 12, the compound semiconductor layered structure in the present invention formed by the MBE method. The compound semiconductor layered structures 47, 48, and 49 are formed by firstly forming, on the GaAs substrate 26, a lower AlGaAsSb layer 47 of 500 nm, an InAs layer 48 of 50 nm, an upper AlGaAsSb layer 49 of 50 nm, and a GaAs layer of 10 nm thereon as an oxidation prevention layer for AlGaAsSb are formed in this order. Thereafter, process techniques such as lithography or etching were used to prepare the magnetic sensor shown in FIG. 4 in which these compound semiconductor layered structures 47, 48, and 49 were used as the magnetic sensitive portion 21 and the trimming portion 23. With regard to the forbidden bandwidths of material constituting the compound semiconductor layered structure, the AlGaAsSb layers 47 and 49 has 1.3 eV, the InAs layer 48 has 0.36 eV, and the GaAs layer has 1.43 eV.

Next, the following section will describe the trimming method to the magnetic sensor. In order to adjust the constant voltage sensitivity, a wafer trimming apparatus including therein a magnet coil for applying a magnetic field to the magnetic sensor on the wafer was used. YAG laser was used as trimming laser that passes through the GaAs layer and AlGaAsSb layer 47 and 49 of the compound semiconductor layered structure and that has a wavelength of 1064 nm (1.17 eV) absorbed by the InAs layer 48. While monitoring the constant voltage sensitivity, laser beam was emitted to the trimming portion 23 and the characteristic adjustment was performed, the result of which is shown below.

When the constant voltage sensitivity before trimming (input voltage of 3V, applied magnetic field of 50 mT) was 120 mV in average for the entire wafer face (the number of elements: 50000) and the standard deviation σ was 5 mV, trimming was performed so that the constant voltage sensitivity was 105 mV, resulting in an average of 105 mV and the standard deviation σ of 0.4 mV. When the variation in the wafer plane was represented by <3σ/average>, the variation could be improved by one digit or more from 12.5% before trimming to 1.1%.

As described above, the trimming portion 23 series-connected via the connection electrode 24 to the magnetic sensitive portion 21 is subjected to laser trimming while performing the wafer probing (electric test). This can consequently provide the adjustment of the constant voltage sensitivity, thus providing a magnetic sensor that has a superior mass productiveness and that has a small characteristic variation.

Illustrative Embodiment 4

Figure 15:
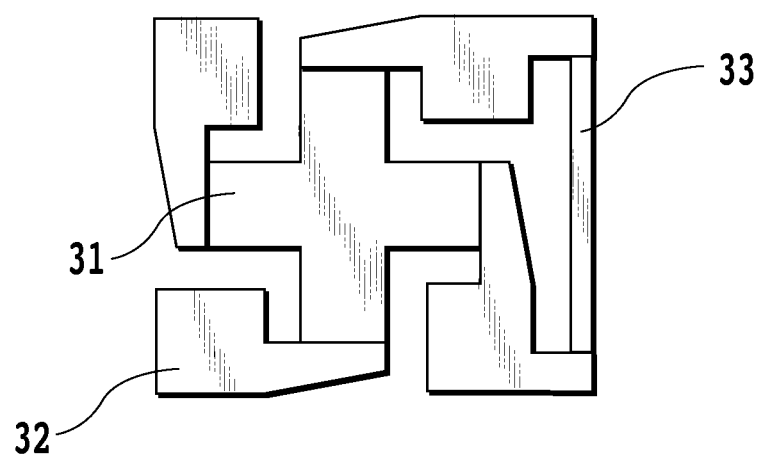
FIG. 15 is a configuration diagram illustrating Illustrative Embodiment 4 in the magnetic sensor of the present invention.
Figure 16:
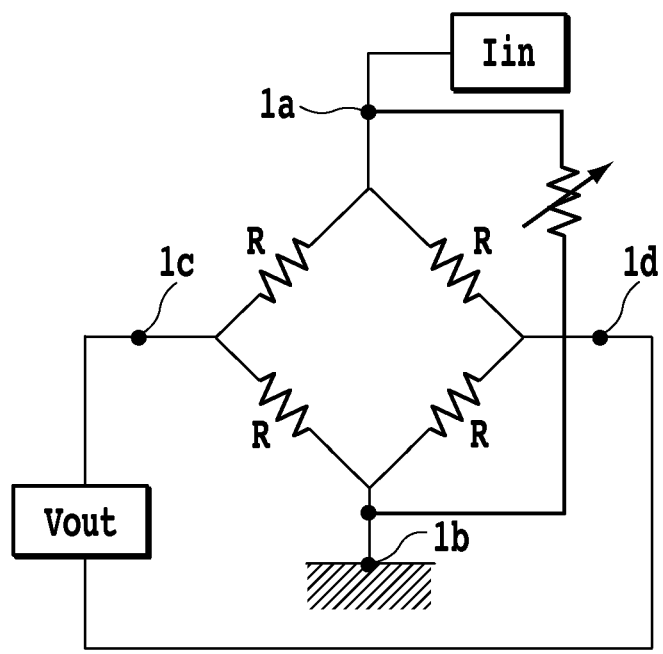
FIG. 16 is a circuit diagram illustrating the equivalent circuit of FIG. 15.

FIG. 15 is a configuration diagram illustrating Illustrative Embodiment 4 in the magnetic sensor of the present invention. FIG. 16 shows an equivalent circuit. By parallel-connecting the trimming portion to the input terminal of the magnetic sensitive portion, the constant current sensitivity can be adjusted.

The Hall element of FIG. 15 was prepared to have the same film structure as that of Illustrative Embodiment 3. While monitoring the constant current sensitivity, laser beam was emitted to the trimming portion 23 and the characteristic adjustment was performed, the result of which is shown below.

When the constant voltage sensitivity before trimming (input voltage of 5 mA, applied magnetic field of 50 mT) was 145 mV in average for the entire wafer face (the number of elements: 50000) and the standard deviation σ was 7 mV, trimming was performed so that the constant voltage sensitivity was 170 mV, resulting in an average of 170 mV and the standard deviation σ of 0.9 mV. When the variation in the wafer plane was represented by <3σ/average>, the variation could be improved by about one digit from 14.4% before trimming to 1.6%.

As described above, by performing laser trimming while performing wafer probing (electric test) on the trimming portion 33 parallely-connected to the magnetic sensitive portion 31, the constant current sensitivity can be adjusted. Thus, such a magnetic sensor cam be provided that has a superior mass productiveness and that has a small characteristic variation. The reference numeral 32 denotes a bonding electrode pad.

The invention claimed is:

1. A magnetic sensor including a magnetic sensitive portion composed of a compound semiconductor provided in a substrate comprising:
   the magnetic sensitive portion that has a predetermined-shaped pattern; and
   the magnetic sensitive portion that includes an input terminal pair and an output terminal pair;
   wherein at least one of input terminals of the input terminal pair is series-connected to a trimming portion having the compound semiconductor via a connection electrode,
   wherein a straight line between the one of input terminals of the input terminal pair that is connected to the trimming portion and the other of the input terminals of the input terminal pair and a straight line between one of output terminals of the output terminal pair and the other of the output terminals of the output terminal pair cross at right angle.

2. The magnetic sensor according to claim 1, wherein the trimming portion includes a trimming layer and a first compound semiconductor layer provided on the trimming layer, and the first compound semiconductor layer is made of material through which trimming laser beam passes.

3. The magnetic sensor according to claim 2, wherein the trimming portion includes a trimming layer and a second compound semiconductor layer provided under the trimming layer, and the second compound semiconductor layer is made of material through which trimming laser beam passes.

4. The magnetic sensor according to claim 3, wherein the first and second compound semiconductor layers are an AlGaAsSb layer and the trimming layer is an InAs layer.

5. The magnetic sensor according to claim 1, wherein the trimming portion includes a trimming layer and a second compound semiconductor layer provided under the trimming layer, and the second compound semiconductor layer is made of material through which trimming laser beam passes.

6. The magnetic sensor according to claim 5, wherein the second compound semiconductor layer is an AlGaAsSb layer and the trimming layer is an InAs layer.

7. The magnetic sensor according to claim 1, wherein material for the trimming portion is the same as the compound semiconductor for the magnetic sensitive portion.

8. The magnetic sensor according to claim 1, wherein the straight line between the one of the input terminals of the input terminal pair that is connected to the trimming portion and the other of the input terminals of the input terminal pair and the straight line between one of the output terminals of the output terminal pair and the other of the output terminals of the output terminal pair cross at right angle within an area of the magnetic sensitive portion.

9. The magnetic sensor according to claim 1, wherein the magnetic sensitive portion has a cross-shaped pattern.

10. The magnetic sensor according to claim 2, wherein the first compound semiconductor layer is an AlGaAsSb layer.

11. The magnetic sensor according to claim 2, wherein the trimming layer is an InAs layer.

12. The magnetic sensor according to claim 5, wherein the second compound semiconductor layer is an AlGaAsSb layer.

13. The magnetic sensor according to claim 5, wherein the trimming layer is an InAs layer.

* * * * *